United States Patent [19]

Teare

[11] 3,801,933

[45] Apr. 2, 1974

[54] LOW NOISE DETECTOR AMPLIFIER

[75] Inventor: Melvin John Teare, Pierrefonds, Quebec, Canada

[73] Assignee: RCA Limited, St. Anne De Bellevue, Quebec, Canada

[22] Filed: Apr. 21, 1972

[21] Appl. No.: 246,468

[30] Foreign Application Priority Data

Apr. 17, 1972 Canada ............................ 139882

[52] U.S. Cl. ...................... 330/35, 330/18, 330/24, 330/27, 250/206

[51] Int. Cl. ........................................ H03f 3/16

[58] Field of Search .......... 330/35, 27, 18; 250/206

[56] References Cited

UNITED STATES PATENTS

| | | | |
|---|---|---|---|
| 3,401,349 | 9/1968 | Mitchell | 330/35 X |
| 3,660,772 | 5/1972 | Holt | 330/18 |
| 3,525,050 | 8/1970 | Wolf et al. | 330/35 X |
| 3,517,325 | 6/1970 | Blackmer | 330/35 X |
| 3,516,004 | 6/1970 | Burns | 330/35 X |

*Primary Examiner*—Nathan Kaufman
*Attorney, Agent, or Firm*—Edward J. Norton; Joseph D. Lazar

[57] ABSTRACT

An amplifier of electromagnetic wave energy in the visible and infrared range includes a photo sensitive detector coupled to a pair of cascoded field-effect transistors arranged to operate at substantial unity gain. A positive feedback path includes the input capacitances of the amplifier reducing and thereby neutralizing the input capacitances of the amplifier. The bandwidth of the amplifier is extended relative to the neutralization of the input capacitances.

6 Claims, 4 Drawing Figures

PATENTED APR 2 1974 3,801,933

LOW NOISE DETECTOR AMPLIFIER

BACKGROUND OF THE INVENTION

1. Field of the Invention

This invention relates to amplifiers of electromagnetic wave energy and more particularly to light energy detector amplifiers of broad bandwidth and stabilized sensitivity.

2. Description of the Prior Art

Amplifiers and preamplifiers of signals detected by transducers particularly, photo transducers, inherently include noise that affects the signal to noise ratio of the system and thereby degrades the performance characteristics. Transducers such as germanium and silicon photodiodes, pyroelectric detectors, hydrophones or microphones, have a capacitance as their dominant impedance term. It is well known that the bandwidth of an RC amplifier is inversely proportional to the input capacitance. It is desirable therefore, to reduce the input capacitance and thereby increase and thereby improve the bandwidth of such amplifying systems.

A number of circuit arrangements have heretofore been devised to neutralize the effects brought about by the input capacitances particularly in the low signal voltage input levels. In general, these prior art circuit arrangements reduce a negative feedback signal to prevent multiplication of the capacitances of the amplifier but do not neutralize the input capacitances to the amplifier developed across the signal detecting transducers or inherently within such transducers.

SUMMARY OF THE INVENTION

According to the present invention the total input capacitance of an amplifier or preamplifier of signals from a transducer are neutralized by providing a positive feedback path from one transistor in cascode relation with a second transistor, the cascode pair of transistors being operated at substantially unity gain and unconditionally stable. The feedback path includes the input capacitances and thereby neutralizes them to the extent that the gain of the cascode amplifiers approach unity.

DETAILED DESCRIPTION OF PREFERRED EMBODIMENTS

Figures 1, 2, 3, 4:
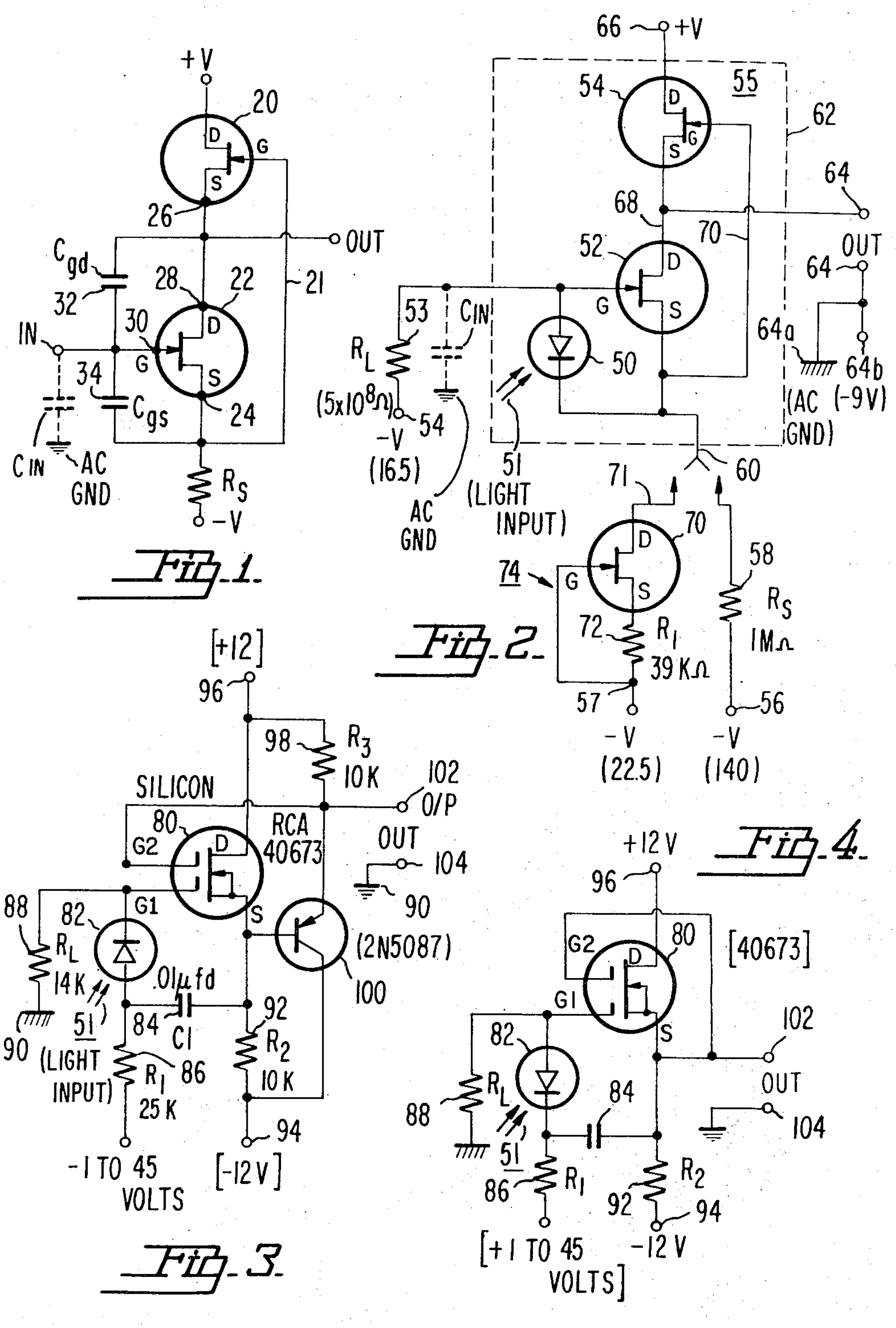
FIG. 1 is a schematic of the circuit arrangement illustrating the feature of the invention for neutralizing input capacitances.
FIG. 2 is a circuit diagram of one embodiment of the invention.
FIG. 3 is a circuit diagram of another embodiment using a dual gate MOS FET transducer.
FIG. 4 is a circuit diagram of a modification of the circuit of FIG. 3.

According to the invention positive feedback is employed to reduce the total input capacitance of an infrared detector so that the RC time constant is proportionately reduced by factors of 100 and as much as 10,000. A reduction in the RC time constant improves the high frequency response, but because of noise considerations it is not possible to decrease the load which is usually in the form of a resistor.

The equivalent circuit of a detector can be shown to be a capacitor in parallel with a current generator. Thus the output voltage of an amplifier of the detector signal will be determined by the current of the detector through the load resistance of the detector.

The output noise voltage of the amplifier is usually represented by the following equation:

$$N_{out} = \sqrt{4\,K\,T\,B\,R_L} \qquad (A)$$

where K is Boltzmann's constant, T is the temperature in degrees Kelvin, B is bandwidth in Hertz, and $R_L$ is the load resistance of the detector in ohms.

It is known that the noise equivalent of power (NEP) is the power required to produce an output signal equivalent to the output noise voltage ($N_{out}$). Thus, if the load resistance ($R_L$) is doubled, the output noise voltage ($N_{out}$) increases by $\sqrt{2}$ and the output signal doubles for a constant power input. Hence the NEP is improved by being reduced.

In systems where maximum sensitivity is desired, the detector load ($R_L$) is increased until the noise of the detector is the limiting design factor. Accordingly, $R_L$ cannot be reduced to increase the bandwidth of the detector amplifier where maximum sensitivity is desired. One method of improving the frequency response without degrading the noise performance of the system is by reducing if not cancelling the capacitance of the detector and any other capacitances in parallel with the detector. Neutralizing the total input capacitance of an amplifier will improve the bandwidth without degrading sensitivity.

Positive feedback is utilized according to this invention to achieve the desired neutralization. The circuit shown in FIG. 1 illustrates the principle used to achieve neutralization. A pair of field-effect transistors (FET), preferably the diffused type, 20 and 22 are shown in FIG. 1 with a gate (G) of transistor 20 connected to the source terminal (S) 24 of transistor 22 and source terminal (S) 26 of transistor 20 in turn connected to drain terminal (D) 28 of transistor 22. The inter-electrode capacitances 32 and 34 corresponding respectively to $C_{gd}$ and $C_{gs}$ are shown as lumped parameters of the distributed capacitances that exist externally between the terminals of transistor 22.

It can be shown that voltage gain ($A_v$) may be represented by the following equation:

$$A_v = g_{fs} \times R_s / 1 + g_{fs} \times R_s \qquad (1)$$

where $g_{fs}$ is the forward transconductance in mhos, and $R_s$, in ohms, is the load connected to the source of FET 22.

As shown, the input capacitance ($C_{in}$) of an FET transducer is equal to the sum of the two interterminal capacities:

$$C_{in} = c_{gd} + C_{gs} \qquad (2)$$

where $C_{gd}$ and $C_{gs}$ are the inter-terminal capacitances of the transistor 20 as shown in FIG. 1, and any other capacitances shunted across them.

Transistor 22 can be biased to operate as a source follower with less-than-unity gain in cascode relation with the FET 20. Positive feedback is achieved over conductor 21 and, with close control of the feedback voltage to achieve close to unity gain, the stage is an unconditionally stable positive feedback amplifier. The circuit of FIG. 1 will substantially neutralize the input capacitance ($C_{in}$), defined by equation (2), by the relation:

$$C_{(neutralize)} = C_{in} \times (1 - A_v) \qquad (3)$$

where $A_v$ is the gain equation (1).

Neutralization or reduction of the input capacitance is achieved by providing positive feedback through the input capacitance to the input of the amplifier having a gain approaching unity. Thus, an amplifier with a gain of 0.99 will effect a reduction of capacitance by a factor of 100 while a gain of 0.999 will effect a reduction of capacitance by a factor of 1,000.

As the gain $A_v$ approaches unity, the input capacitance reduces toward zero. The gain of the stage can be increased toward unity by replacing the resistance $R_s$ with a dynamic load such as a transistor, as will be illustrated in FIG. 2.

One embodiment of the invention will now be described with reference to FIG. 2. A photodiode detector 50, such as a germanium diode, is connected in circuit with a field-effect transistor (FET) 52 having gate, drain, and source terminals. The diode 50 is connected across the gate and source as shown, a load resistor $R_L$ (53) being connected to the negative terminal of the diode and to a negative voltage 54. The source (S) terminal of the FET 52 is connected to a negative voltage supply 56 through resistor ($R_s$) 58, connected to terminal 60 of shielded housing 62. The output of the cascode amplifier 55 is provided at terminals 64 wherein the reference ground 64*a* is common to the negative d.c. voltage supply 64*b*.

A positive feedback path for the amplifier is established by the FET amplifier 54 whose drain electrode (D) is connected to positive voltage source 66 and whose source electrode (S) is connected to the drain (D) of amplifier 52 via conductor 68. The positive feedback path is provided by the source of FET 52 coupled to the gate (G) of FET 54 via conductor 70 returning to FET 52 via conductor 68.

The $R_L$ resistor 53 is usually of large ohmic value, for reasons to be explained. such as $5 \times 10^8$ ohms. A voltage of about 4 to 6 volts is provided for the source terminal of FET 52 and thereby establishes the bias voltage for the diode detector 50.

The diode 50 generates a current proportional to its excitation, such as an infrared signal 51, which diode current, in turn developes a voltage across the $R_L$ resistor 53. The output at terminals 64 is proportional to the ohmic value of the resistor $R_L$. Thus, the amplifier output signal voltage at terminals 64 increases directly with increasing values of $R_L$. The output noise voltage, however, as previously described, increases as the square root of the increasing values of $R_L$. Accordingly, the signal to noise ratio, for a given signal input to diode 50 increases directly as $R_L$ increases.

In theory, increased values of $R_L$ should cause the shot noise generated by the detector 50 to be the predominate noise at the amplifier output terminals 64. However, in practice, resistor $R_L$ is usually selected to be relatively small to meet the bandwidth requirement of the detector and its following amplifier.

A useful expression for determining bandwith (B) in Hertz of the amplifier is:

$$B = 1/2\pi RC \qquad (4)$$

where R is the load resistor $R_L$ in ohms, and C is the total input capacitance $C_{in}$.

It should be noted that $C_{in}$ (equation 2) of the detector amplifier combination is the sum total of all capacitances as seen between the input terminal to the gate and a.c. ground of FET 22. This $C_{in}$ includes $C_{gd}$ and $C_{gs}$, inter-terminal capacity, stray capacity and interterminal capacity of $R_L$. $C_{in}$ is shown in dotted line in FIG. 1 between the input terminal and a.c. ground, it being understood that this is a lumped capacitance equivalent to that capacitance defined by equation (2). It should be further noted that all capacitances except the interterminal capacity of the load resistor $R_L$ can be neutralized with nearly substantially unity gain feedback without adding noise to the system. The value of C in equation (4) includes the inter-terminal capacity of $R_L$ in parallel with the effective value of all neutralized capacities plus the stray or other capacities which are too difficult to neutralize since they are not easily isolated.

The FET's 52 and 54 of FIG. 2 are typically the commercial type 2N4222A having a high pinch-off voltage, preferably, 4 to 6 volts. FET 52 operates as a source follower with a reverse bias of about 5 volts with an operating current of 140 microamps.

Instead of a passive resistor $R_s$, a dynamic impedance 74 comprising a similar type FET 70 is connected to negative voltage 57 typically 22.5 volts, via $R_1$ resistor 72, typically 39K ohms, with the terminal connections shown via lead 71 to terminal connection 60. The dynamic impedance 74, as known, provides adequate operating current at low battery voltages for the amplifier and will improve the gain characteristic so as to approach unity.

The detector is typically a type M 708 infrared detector. The $R_L$ resistor 53 is typically $5 \times 10^8$ ohms connected to $-16.5$ volts to provide the reverse bias of 5 volts on the detector diode 50. In addition to this automatic biasing arrangement, FET 52 is also reversed bias to bias thereby the detector 50.

The capacitance, $C_{gs}$, between the source and gate of FET 52 as well as the internal capacitance of the detector 50 is neutralized in the manner described for the circuit illustrated in FIG. 1, since, it will be noted, the diode is connected in parallel with the capacitance, $C_{gs}$.

Design calculations show that the input capacitances of the amplifier of about 50 pica farads are reduced by a factor of 1,000 to about 0.05 pica farads. This is achieved by the gain of FET 52 being 0.999 determined by operating it with low current of about 100 microamps, whereby the forward transconductance $g_{fs}$ is about 1,000 micromhos. The resistance $R_s$ of equation (1) is effectively the impedance of the FET 70 represented by the known expression:

$$Z_s = R_1 + (1 + R_1\ g_{fs}/Y_{os}) \qquad (5)$$

where $g_{fs}$ is the forward transconductance of FET 70 and $Y_{os}$ is the output admittance. A calculation of equation (5) for FET 52 shows $Z_s$ to be about one megohm resulting in a gain of 0.999 calculated from equation (1).

FET 54 in cascode with FET 52, maintains the FET 52 drain to source voltage at a substantially constant value, an operation known in the art as "bootstraping." Thus, the capacitance $C_{dg}$ across the drain and gate of FET 52 is neutralized or reduced from a value of 3 pica farads to 0.003 pica farads. This value is determined from the relation:

$$C_{eff} = C_{dg} [1 - AV_{52} \times Av_{54}] \quad (6)$$

where $Av_{52}$ and $Av_{54}$ are the voltage gains of FET's 52 and 54, as determined by equation (1). It should be noted that the effective voltage gain of the cascode amplifier according to this invention is 0.999, significantly, nearly unity.

The total input capacitance, C, of the amplifier 55 is the sum of the $C_{in}$ (0.05pf), $C_{eff}$ (0.003 pica farads) (p.f.), and the shunt capacitance contributed by the diode load resistor 53 of about 1.2 p.f. The total C is thus 1.25 pica farads. The bandwidth, using equation (4) is calculated to be 255 Hertz. A measurement of the bandwidth of an operating amplifier was 350 Hertz which compares favorably with the design calculation. The difference is due to distributed capacitances of the load resistor $R_L$ (53) which are difficult to determine.

The effective noise power (NEP) of the amplifier is limited by (1) the noise in the diode load resistor $R_L$ (53); (2) the noise in the diode detector 50; and (3) the noise in the FET 52. The noise of FET 54 does not contribute to the NEP of the amplifier output 64 because its noise is relatively insignificant as compared to the noise generated by the load resistor $R_L$.

The noise levels in which detector transducers must operate to achieve acceptable signal-to-noise levels in existing amplifiers is quite small. Detectors responsive to electromagnetic radiation, particularly in the infrared and near infrared, as well as the visible wavelengths include pyroelectric detectors, silicon photodiodes, avalanche diodes and other so-called photodiodes.

Such devices, which may be classed for this description as photodiode detectors, usually have a very large impedance, which can be shown to be equivalent to a capacitance and resistance in parallel. The resistance value of this equivalent impedance is usually very much larger than the reactance of the capacitance so that the effective operating impedance of the detector is essentially a capacitor. Light energy in the form of photons is detected by such a detector, which generates a current developing a potential difference across a load connected to the detector. The potential difference is proportional to the input incident energy which serves as a signal. This signal is amplified to develop the useful output from the detector.

In certain types of detectors such as germanium or silicon types and certain pyroelectric types, the noise that exists in photodiode detectors may be reduced, in part, by cooling the device. Germanium detectors, for example, operate most efficiently in the near-infrared ranges of operation at 77° K. The silicon and pyroelectric detectors may operate, as known in the art, at higher temperatures up to 100° C and over.

It should be appreciated that in use of the present invention a system requiring high sensitivity may be achieved with high values of load resistance. High ohmic values of load resistance ($R_L$) as known are required for high sensitivity of transducers. Heretofore the degrading effects of input capacitances led to reduced load resistance values as a compromise. According to the present invention, the reduction of the input capacitance by the positive feedback path to the input circuit, allows for the use of large load resistors to achieve the benefits of high sensitivity.

FIG. 3 illustrates another embodiment of the invention using a dual-gate MOS FET (metal-oxide-semiconductor field-effect transistor). Such transistors have two independent insulated gates (G1 and G2) and exhibit all the operating features of a single-gate FET of the type described in relation to FIG. 2. In the arrangement of FIG. 3, the FET 80 is typically a silicon type (RCA type 40673) and coupled to the diode 82 through a capacitor 84 typically 0.01 mfd. The diode 82 is biased through a resistor 86 typically 25K ohms, to a negative source of voltage in the range of 1 to 45 volts depending upon the type of detector 82 that is to be used. The load of the detector 82 is an $R_L$ resistor 88, typically, 14K ohms, coupled to a.c. ground 90 and to a common connection of G1 and the diode 82. The bias for the transistor 80 includes a resistor 92 of typically 10K ohms connected to a negative power supply source 94, suitably 12 volts. The drain (D) of transistor 80 is connected to positive 12 volt source 96 while a resistor 98, typically 10K ohms, is connected to G2 of the transistor 80. A transistor 100, typically 2N5087, is arranged in the circuit as a buffer to increase the bias for G2 of transistor 80. The output of the amplifier stage is derived from terminals 102 and 104, terminal 104 being coupled to the ground 90. The input signal 51 from a source of electromagnetic radiant energy in the optical or infrared range, is detected by a suitable diode detector 82.

The circuit of FIG. 3 provides essentially the same cascode arrangement of two separate FETs as embodied in FIG. 2. The operation of the amplifier of FIG. 3 accordingly is essentially the same as the circuit described for FIG. 2 and need not be repeated. One feature of FIG. 3, it should be noted, provides for the operating advantage of having a totally independent bias voltage for the transistors 80 and 100 and for the detector 82. The capacitor 84 provides for the positive feedback coupling to the detector 82 to neutralize or reduce the detector capacitances according to the invention, and in addition provides a means to implement an independent bias to the detector 82 by isolating the two bias supplies 94 and 95. Transistor 100 serves in the circuit as a buffer to provide a low output impedance at terminals 102 and 104.

Referring now to FIG. 4 there is shown a modification of the circuit of FIG. 3 for use with high impedance outputs wherein the buffer 100 is eliminated. The components of the circuit corresponding to that of FIG. 3 are identified with the same reference numerals. The circuit of FIG. 4 is essentially the same as that of FIG. 3 except that the diode 82 is connected in reverse polarity requiring thereby a positive bias source in the range of 1 to 45 volts, again, the magnitude of which depending upon the choice of the detector 82. The source of current to transistor 80 through resistor 92 may be replaced by a constant current source such as current source 74 illustrated and described with respect to FIG. 2. The operation of the circuit illustrated in FIG. 4 will be apparent in view of the preceding description for FIG. 2.

What is claimed is:

1. A signal translating circuit responsive to wave energy signals comprising:

a pair of field-effect semiconductor devices each having a gate, drain and source electrode, input means coupled to the source and gate of one of said devices, said input means including a transducer generating an electrical current in response to receipt of said wave energy and an impedance coupled to receive said electrical current from said transducer, said transducer exhibiting capacitance to said source and gate electrodes of said one device, the source electrode of said one of said devices being coupled to the gate electrode of the other of said devices to provide a positive feedback path whereby an electrical potential at said source of said one device is substantially the same as the electrical potential at said gate of said other device, the drain of said one device being connected to said source of said other device, each of said devices being operated unconditionally stable at a gain closely approaching but less than unity by coupling the source electrode of said one device to a supply of substantially constant current, wherein, in response to said wave energy the difference in electrical potential between said source and gate electrodes and said gate and said drain electrodes of said one device respectively is substantially zero, to thereby substantially reduce the input capacitance between said source and said gate electrode and the stray capacitance between said gate and drain electrode of said one device.

2. A circuit according to claim 1 wherein said source of said one device is directly connected to the gate of said other device.

3. A circuit according to claim 1 wherein said source of said one device is connected to the base of a transistor, and the gate of said other device is connected to the emitter of said transistor, said transistor being arranged to provide a bias voltage on said gate of said other device which is greater than the bias on said gate of said one device.

4. A circuit according to claim 1 wherein the gain of each of said devices is in the order of 0.99.

5. A circuit according to claim 6 wherein said field-effect devices are of the junction type.

6. A circuit according to claim 6 wherein said field-effect devices are formed as a metal-oxide-semiconductor field-effect transistor, said transistor having separate insulated gates formed on the base thereof.

* * * * *